(12) United States Patent
Stefanescu

(10) Patent No.: US 9,917,067 B1
(45) Date of Patent: Mar. 13, 2018

(54) ELECTRONIC DEVICE INTERCONNECTIONS FOR HIGH TEMPERATURE OPERABILITY

(71) Applicant: KULITE SEMICONDUCTOR PRODUCTS, INC., Leonia, NJ (US)

(72) Inventor: Sorin Stefanescu, New Milford, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

(21) Appl. No.: 15/419,280

(22) Filed: Jan. 30, 2017

(51) Int. Cl.
| | |
|---|---|
| *H01L 23/06* | (2006.01) |
| *H01L 23/02* | (2006.01) |
| *H01L 23/48* | (2006.01) |
| *H01L 21/44* | (2006.01) |
| *H01L 23/00* | (2006.01) |

(52) U.S. Cl.
CPC ............... *H01L 24/05* (2013.01); *H01L 24/03* (2013.01); *H01L 24/45* (2013.01); *H01L 2224/04042* (2013.01); *H01L 2224/0508* (2013.01); *H01L 2224/05083* (2013.01); *H01L 2224/05084* (2013.01); *H01L 2924/14* (2013.01); *H01L 2924/146* (2013.01); *H01L 2924/201* (2013.01); *H01L 2924/2011* (2013.01); *H01L 2924/20108* (2013.01); *H01L 2924/20109* (2013.01); *H01L 2924/20111* (2013.01); *H01L 2924/365* (2013.01)

(58) Field of Classification Search
CPC ......... H01L 24/03; H01L 24/05; H01L 24/45; H01L 2924/20108; H01L 2924/20111; H01L 2924/20109; H01L 2924/14; H01L 2924/146; H01L 2924/201; H01L 2224/0508; H01L 2224/05084; H01L 2224/05083; H01L 2224/04042
USPC ......... 438/612–618; 257/734, 737, 684, 686, 257/700

See application file for complete search history.

(56) References Cited

U.S. PATENT DOCUMENTS

| | | | |
|---|---|---|---|
| 5,955,771 A | 9/1999 | Kurtz et al. | |
| 2009/0302319 A1* | 12/2009 | Cho | H01L 27/1214 257/59 |

* cited by examiner

*Primary Examiner* — Hsien Ming Lee
(74) *Attorney, Agent, or Firm* — Troutman Sanders LLP; James E. Schutz; Mark Lehi Jones

(57) ABSTRACT

Systems and methods are disclosed for providing an interconnection for extending high-temperature use in sensors and other electronic devices. The interconnection includes a semiconductor layer; an ohmic contact layer disposed on a first region of the semiconductor layer; an insulating layer disposed on a second region of the semiconductor layer, where the second region differs from the first region; a metal layer disposed above at least the insulating layer and the ohmic contact layer; and a connecting conductive region disposed on the metal layer and in vertical alignment with a third region of the semiconductor layer. The third region differs from the first region and is offset from the ohmic contact layer at the first region. The offset is configured to extend an operational lifetime of the interconnection apparatus, particularly when the interconnection apparatus is exposed to high temperature environments.

22 Claims, 10 Drawing Sheets

ELECTRONIC DEVICE INTERCONNECTIONS FOR HIGH TEMPERATURE OPERABILITY

FIELD

The disclosed technology relates to electronic device interconnections suitable for high temperature operability, and in particular, to metallization and layout configurations for improving ohmic contact reliability.

BACKGROUND

Metallization is a fabrication step that can be utilized to make interconnections among circuit elements of an electronic device. For example, a metallization process may be utilized to connect wires to bonding pads on an integrated circuit chip via ohmic contacts. In high-temperature applications, the metallization typically relies on three separate components: (1) a silicide for producing an ohmic contact with a semiconductor; (2) the top metal layer; and (3) a barrier metal between the top metal layer and the silicide. The barrier metal may be utilized to prevent diffusion, drift, and/or migration of metal atoms between the layers and/or wires of the structure. For example, the barrier may be utilized to prevent metal atom migration between the top layer metallization (including any attached electrical interconnection) and the underlying silicide contact.

Various multilayer metallurgical schemes have been proposed to achieve high temperature operability, with a temperature capability based on specific properties associated with each metal layer. However, the capability to withstand high temperatures (for example, above 600° C.) for long periods of time (for example, over 1000 hours) is limited by the diffusion, drift, and/or migration of metal atoms between the layers and/or wires of the structure.

A need exists for systems and methods for producing integrated circuits capable of reliable operation at elevated temperatures.

BRIEF SUMMARY

Some or all of the above needs may be addressed by certain implementations of the disclosed technology. Certain implementations of the disclosed technology may include systems and methods for electronic device interconnection metallization for high temperature operability.

In one example implementation, an interconnection apparatus is provided that can include: a semiconductor layer; an ohmic contact layer disposed on a first region of the semiconductor layer; an insulating layer disposed on a second region of the semiconductor layer, where the second region differs from the first region; a metal layer disposed above at least the insulating layer and the ohmic contact layer; and a connecting conductive region disposed on the metal layer and in vertical alignment with a third region of the semiconductor layer. The third region differs from the first region and is offset from the ohmic contact layer at the first region. The offset is configured to extend an operational lifetime of the interconnection apparatus when the interconnection apparatus is exposed to temperatures above about 300 degrees C.

In another example implementation, a system is provided. The system can include a sensor device including and in communication with an interconnection. The interconnection includes: a semiconductor layer; an ohmic contact layer disposed on a first region of the semiconductor layer; an insulating layer disposed on a second region of the semiconductor layer, wherein the second region differs from the first region; a metal layer disposed above at least the insulating layer and the ohmic contact layer; a connecting conductive region disposed on the metal layer and in vertical alignment with a third region of the semiconductor layer. The third region differs from the first region and is offset from the ohmic contact layer at the first region, and the offset is configured to extend an operational lifetime of the sensor device when the sensor device is exposed to temperatures above about 300 degrees C.

In another example implementation, a method is provided. The method can include configuring an interconnection on at least a portion of an electronic device. The interconnection includes: a semiconductor layer; an ohmic contact layer disposed on a first region of the semiconductor layer; an insulating layer disposed on a second region of the semiconductor layer, wherein the second region differs from the first region; a metal layer disposed above at least the insulating layer and the ohmic contact layer; and a connecting conductive region disposed on the metal layer and in vertical alignment with a third region of the semiconductor layer. The method further includes configuring the third region to be offset from the ohmic contact layer at the first region, wherein the offset is configured to extend an operational lifetime of the sensor device when the sensor device is exposed to temperatures above about 300 degrees C.

Other implementations, features, and aspects of the disclosed technology are described in detail herein and are considered a part of the claimed disclosed technology. Other implementations, features, and aspects can be understood with reference to the following detailed description, accompanying drawings, and claims.

DETAILED DESCRIPTION

Figure 1:
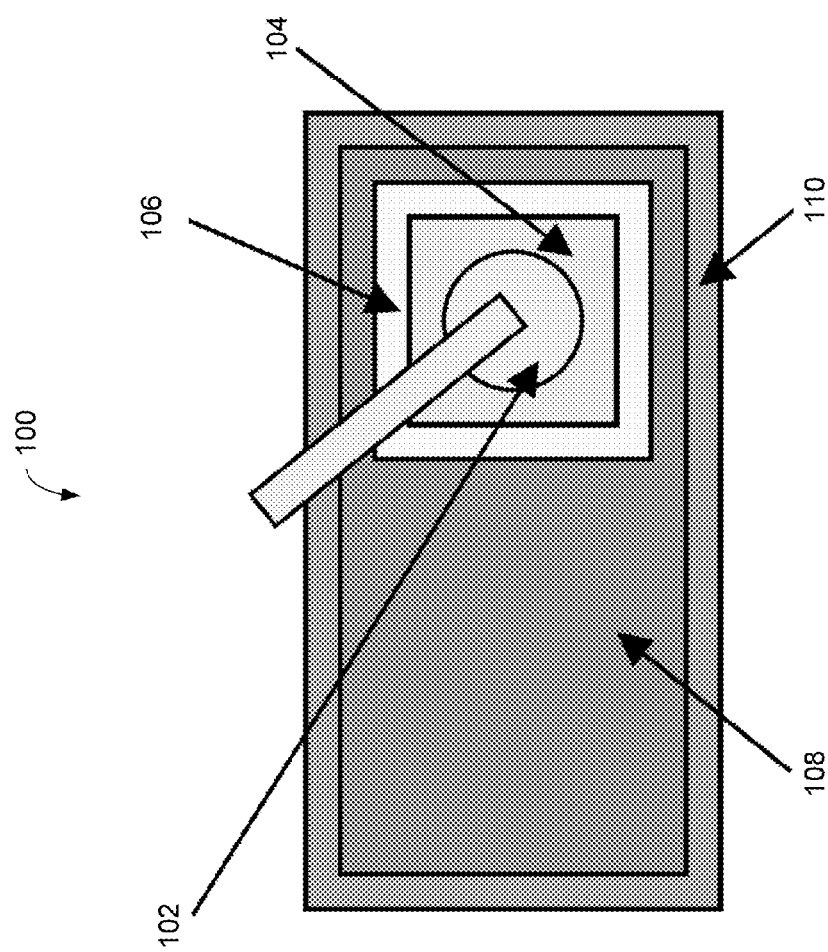
FIG. 1 depicts a top view of a conventional interconnection 100 having a standard metal contact and associated layout.

Certain example implementations of the disclosed technology include devices and techniques for providing electronic device interconnections that can result in increased device lifetime and/or reliability in high temperature environments, for example, in temperatures of approximately 300-600 degrees C. and/or higher. Certain embodiments of the disclosed technology provide improvements over standard integrated circuit layout designs, in which atoms of metal wires used in the wire bonding process can diffuse (or migrate) into associated ohmic contact layers and/or semiconductor layers, thus contaminating the layers and interfering with the function, reliability, and/or lifetime of the device, particularly at elevated temperatures. One approach that has been utilized in standard IC designs in an attempt to reduce the effects of such diffusion (and to increase the device lifetime) is to increase a thickness of barrier layers placed vertically between the wire bond and the corresponding ohmic contact region on the semiconductor, where the ohmic contact region is typically vertically aligned with the wire bond region.

Disclosed herein are certain example metallization configurations that utilize an offset between the wire bond region and the corresponding ohmic contact region of the semiconductor, thereby increasing the path length in which the associated materials (for example, wire bond metal ions, atoms, etc.) must travel to reach the semiconductor and/or the ohmic contact. In this respect, the increased path length (due at least in part to the offset) may provide a corresponding increase in the device lifetime, particularly at elevated temperatures.

The terms "interconnection," "interconnect," "connection," "junction," etc., as used herein, may refer to a physical and/or electrical connection between or among two or more components and/or materials, including but not limited to conductors, semiconductors, insulators, contact pads, wires, barrier layers, oxides, etc.

The term "offset" as used herein may refer to a lateral, transverse, serpentine, circuitous, tortuous, and/or generally non-vertical conductive path between a wire bond and an ohmic contact region of a semiconductor device. In accordance with an example implementation of the disclosed technology, the offset provides the increased path length to increase the device lifetime. In certain example implementations, and as utilized herein, the effective offset may be denoted as "D" (for lateral, transverse, or otherwise linear separation between the wire bond and the ohmic contact regions) and "D'" (for serpentine or circuitous path configurations between the between the wire bond and the ohmic contact regions).

Certain example implementations of the disclosed technology provide a metallization layout and/or pattern scheme suitable for high temperature operability. An aspect of the disclosed technology includes configuring an electrical/electronic interconnection by disposing its ohmic contact region (which can include metal silicide) a predetermined offset "distance" away from certain components/materials of the interconnection, such as may be present in the wire bond region, associated metal layer(s), and/or electrical interconnect to the device. In this respect, the distance for diffusion, drift, or migration (of atoms of materials used for the electrical interconnections associated with the wire bond region) to the ohmic contact may be increased, thus increasing the amount of operation time available before the diffusion, drift, or migration of atoms used in the wire bond can affect the ohmic contact and/or corresponding semiconductor region. In certain example implementations, the ohmic contact region can be offset from the wire bond interconnection region by an effective distance on the order of hundreds of micrometers, which may represent an increase in the distance required for any diffusion, drift, or migration from the materials used for electrical interconnections to reach the ohmic contacts. This increased distance may provide a corresponding increase in the reliable operation lifetime of the device by orders of magnitude over traditional approaches.

Certain example implementations of the disclosed technology may be utilized for metallurgy interconnection schemes for use with sensors, such as piezoresistive transducers. Certain example implementations of the disclosed technology may be suitable for use in electronic devices in general.

FIG. 1 depicts a top view representation of a conventional interconnection 100 approach having a metal wire bond contact and an associated standard layout. The contact pattern layout and structure of the interconnection 100 shown in FIG. 1 includes a wire bond 102, metal-on-metal-silicide layer region 104, metal-on-oxide layer region 106, an oxide layer region 108, and a semiconductor layer region 110.

Figure 2:
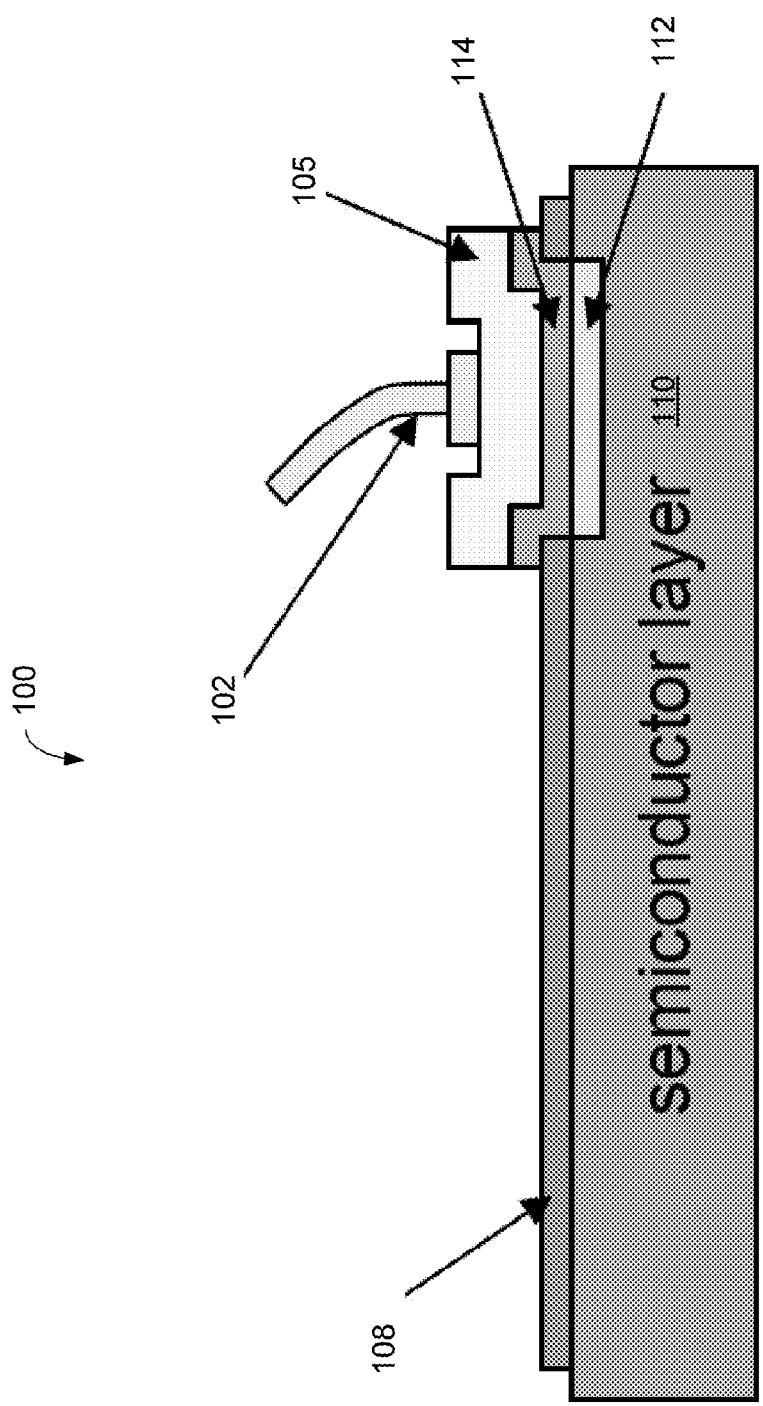
FIG. 2 depicts a cross sectional side-view of the conventional interconnection 100 as shown in FIG. 1.

FIG. 2 depicts a cross sectional side-view representation of the conventional interconnection 100 (as shown in FIG. 1) where a metal silicide layer 112 and a diffusion barrier metallic layer 114 are disposed vertically below the wire bond 102 and the top metal layer 105. In such conventional scheme for the interconnection 100, prevention of the diffusion, drift, and/or migration of metal atoms from the top metal layer 104 to the metal silicide layer 112 may be governed, at least in part, by the diffusion barrier metallic layer 114, which can be less than a micrometer in thickness.

Figure 3:
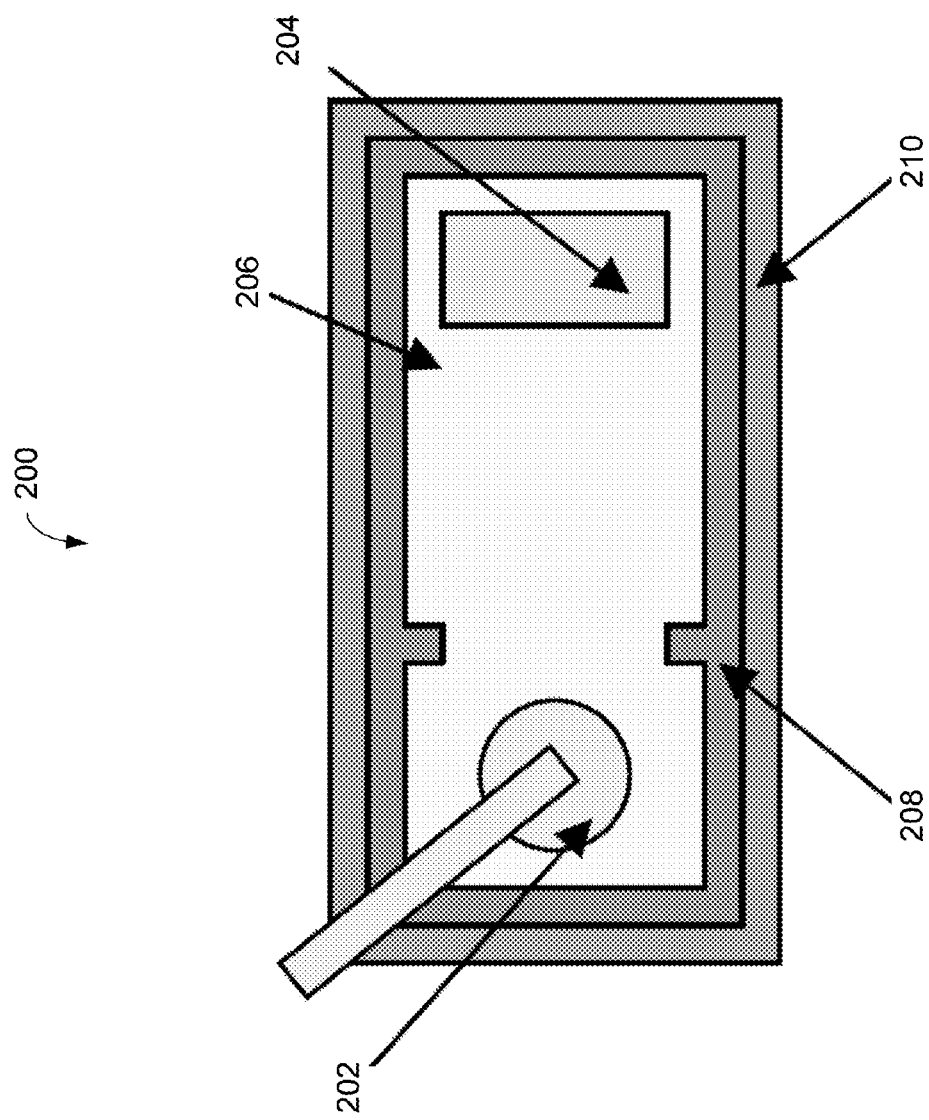
FIG. 3 depicts a top view of an interconnection 200 and associated layout scheme, according to an example implementation of the disclosed technology.

FIG. 3 depicts a top view of an interconnection 200 with an associated layout scheme, according to an example implementation of the disclosed technology. This example implementation includes a wire and wire bond 202, metal-on-metal silicide layer(s) 204 region, metal-on-oxide layer(s) 206 region, an oxide layer 208 region, and a semiconductor layer 210 region.

Figure 4:
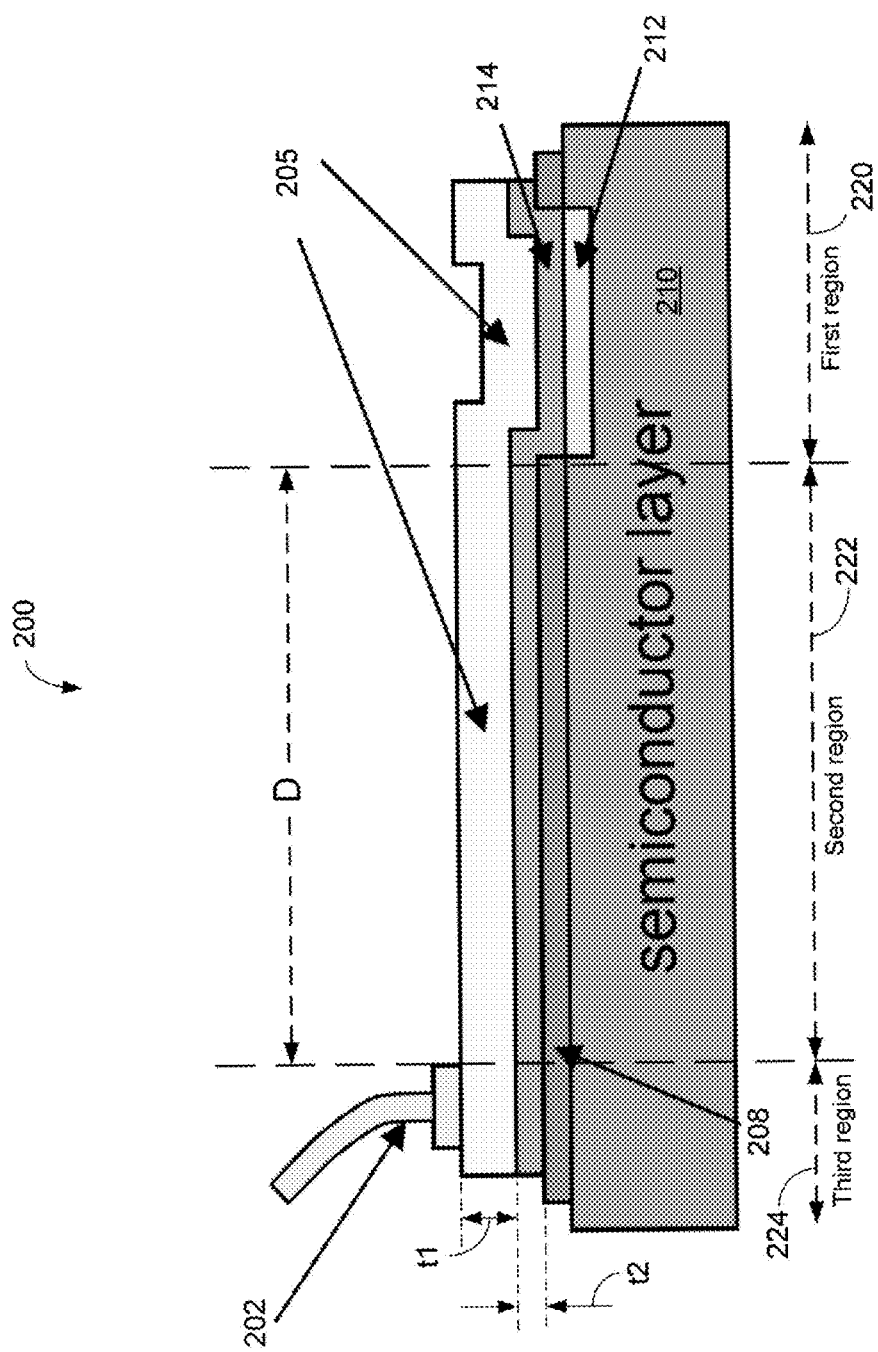
FIG. 4 depicts a cross sectional side-view of the interconnection 200, as shown in FIG. 3, according to an example implementation of the disclosed technology.

FIG. 4 depicts a cross sectional side-view of the interconnection 200, as shown in FIG. 3, according to an example implementation of the disclosed technology. In this example implementation, the wire bond 202 region (within the third region 224) in communication with the top metal layer 205 is offset by a lateral distance D from the metal silicide layer 212 region (within the first region 220). In an example implementation, the metal silicide layer 212 may form an ohmic contact with the semiconductor layer 210 within the first region 220. The thickness of the top metal layer 205 may be characterized by t1, as depicted in FIG. 4. According to an example implementation of the disclosed technology, the effects of diffusion, drift, and/or migration of metal atoms from the wire bond 202 (and/or the top metal layer 205) to the metal silicide layer 212 may be reduced and/or delayed, at least in part, by the offset lateral distance D, and/or the configuration of a large ratio of D to t1. In certain example implementations, the D:t1 ratio may be configured to be in a range from about 2:1 to about 5:1. In certain example implementations, the D:t1 ratio may be configured to be in a range from about 3:1 to about 10:1. In other example implementations, the D:t1 ratio may be configured to be in a range between about 5:1 to about 20:1. In other example implementations, the D:t1 ratio may be configured to be in a range between about 10:1 to about 50:1. In other example implementations, the D:t1 ratio may be configured to be in a range between about 20:1 to about 100:1. In other example implementations, the D:t1 ratio may be configured to be in a range between about 50:1 to about 500:1. In other example implementations, the D:t1 ratio may be configured to be in a range between about 100:1 to about 1000:1. In other example implementations, the D:t1 ratio may be configured to be in a range between about 500:1 to about 5000:1.

In certain example implementations, the third region 224 may be included within the second region 222.

According to certain example implementations of the disclosed technology, the interconnection 200 may further include a diffusion barrier metallic layer and/or an adhesion layer (denoted hereinafter as the diffusion barrier/adhesion layer 214) that may be characterized by a thickness t2. According to certain implementations of the disclosed technology, the diffusion barrier/adhesion layer 214 may be a metal or metal compound. According to an example implementation of the disclosed technology, prevention of the diffusion, drift, and/or migration of metal atoms from the wire bond 202 (and/or the top metal layer 205) to the metal silicide layer 212 may be reduced and/or delayed, at least in part, by the offset lateral distance D, and/or the configuration of a large ratio of D to (t1+t2). In certain example implementations, the D:(t1+t2) ratio may be configured to be in a range from about 2:1 to about 5:1. In certain example implementations, the D:(t1+t2) ratio may be configured to be in a range from about 3:1 to about 10:1. In other example implementations, the D:(t1+t2) ratio may be configured to be in a range between about 5:1 to about 20:1. In other example implementations, the D:(t1+t2) ratio may be configured to be in a range between about 10:1 to about 50:1. In other example implementations, the D:(t1+t2) ratio may be configured to be in a range between about 20:1 to about 100:1. In other example implementations, the D:(t1+t2) ratio may be configured to be in a range between about 50:1 to about 500:1. In other example implementations, the D:(t1+t2) ratio may be configured to be in a range between about 100:1 to about 1000:1. In other example implementations, the D:(t1+t2) ratio may be configured to be in a range between about 500:1 to about 5000:1.

In accordance with an example implementation of the disclosed technology, the offset lateral distance D may be at least four times greater than the thickness of the combined diffusion barrier, which may include the diffusion barrier/adhesion layer 214 and/or the top metal layer 205. In yet other example implementations, the offset lateral distance D may be configured to be between 5 and 100 times greater than the thickness of the combined diffusion barrier. In yet other example implementations, the offset lateral distance D may be configured to be between 100 and 1000 times greater than the thickness of the combined diffusion barrier. In yet other example implementations, the offset lateral distance D may be configured to be at least 1000 times greater than the thickness of the combined diffusion barrier.

According to an example implementation of the disclosed technology, the offset lateral distance D can be configured as needed. For example, in one implementation, the offset lateral distance D can be about 5 micrometers to about 50 micrometers. In another example implementation, the offset lateral distance D can be about 50 micrometers to about 100 micrometers. In yet other example implementations, the offset lateral distance D can be about 100 micrometers to about 500 micrometers. In yet other example implementations, the offset lateral distance D can be about 500 micrometers to about 2000 micrometers or greater.

In accordance with an example implementation of the disclosed technology, the interconnection areas or regions disclosed herein can include one or more of: semiconductor materials, oxides or other dielectrically insulating materials, metal silicides or other metal-semiconductor compounds, and metals, metal alloys, or metal compounds. In an example implementation, the areas or regions of metal silicides, such as in the metal silicide layer 212 (and/or or other metal-semiconductor compounds), may be formed in windows or apertures formed in oxide (or in other dielectrically insulating materials) to provide the ohmic contact to the semiconductor layer 210. According to certain example implementations, the various contacts associated with the interconnections disclosed herein may include a layered structure with metals, metal alloys, and/or metal compounds deposited or formed on top of the metal silicides or other metal-semiconductor compounds, and/or on top of parts of the oxide or other dielectrically insulating layers. In certain example implementations, some of the metals, metal alloys, or metal compounds situated between the top metal layer 205 and the metal silicides (or other metal-semiconductor compounds constituting the ohmic contacts) can serve as diffusion barriers and/or adhesion promoters.

In accordance with an example implementation of the disclosed technology, standard metal contact techniques may be utilized for certain electrical interconnections. For example, the metal silicide layer 212 may be deposited and/or formed on the semiconductor layer 210. In an example implementation, the diffusion barrier/adhesion layer(s) 214 may be deposited over the metal silicide layer 212. In an example implementation, the top metal layer 205 may deposited over the diffusion barrier/adhesion layer(s) 214. In an example implementation, the wire bond 202 may be bonded to the top metal layer 205. In accordance with an example implementation of the disclosed technology, the wire bond(s) 202 can be made with one or more of: gold, platinum, or other appropriate metal or metal alloy. Alternatively, electrical interconnections to the top metal layer can be made using welding, flip chip technology, leadless technology (such as described in U.S. Pat. No. 5,955,771, incorporated herein by reference, as if presented in full), cured or fired conductive metal-containing pastes or thick films, conductive glass-metal powders or frits, or metal powders.

For high temperature sensor and/or electronic device applications, the different layers of the interconnection 200 and associated contact structure may be selected to maintain stability at high temperatures. Furthermore, in an example implementation, the relative placement and offset of the wire bond 202 (or other contact point/pad as described above) with respect to the metal silicide layer 212 may be utilized to limit, delay, or minimize diffusion, drift, and/or migration of atoms from the different contact layers at high temperatures so that the contact remains functional and operational at high temperatures. In certain example implementations, the materials constituting the various layers of the electrical interconnections and wire bonding may be selected to maintain stability at high temperatures, and configured with limited/minimized interaction and diffusion, drift, and/or migration of atoms between or among the layers of the contacts, wires bonds, wires, and/or any contact materials used for interconnections or bonds. Certain example implementations of the disclosed technology can provide the technical benefit of reducing diffusion, drift, and/or migration of atoms between and among the associated interconnection layers, thereby increasing the reliability of the ohmic contact, and in turn, increasing the reliability of the associated electronic device or sensor.

In accordance with an example implementation of the disclosed technology, the interconnection 200 as depicted in FIGS. 3 and 4 may include a significantly larger lateral offset length dimension of the top metal layer 205 region as compared with a top metal layer 105 region used in the conventional approach (as depicted in FIGS. 1 and 2). In certain example implementations, the interconnection 200 may also include a significantly larger lateral length dimension of the top metal layer 205 region as compared with the metal silicide layer 212 region, and may extend over a significant length/distance from the metal silicide layer 212, for example, from the first region 220, through the second region 222, and to within the third region 224. In one example implementation, the lateral length dimension of the top metal layer 205 region may be configured to be about 2 to over 10 times the lateral length dimension of the conventional top metal layer 105 region, and extending away from the metal silicide layer 212 region over a distance/length of about 2 to over 10 times the size or lateral dimensions of the metal silicide layer 212 region. Furthermore, as discussed above, the electrical interconnections (for example, made by wire bonding or by other appropriate joining techniques) may be made so that they are laterally separated from, but electrically connected to the metal silicide, and are not aligned over the metal silicide (or over other metal-semiconductor compounds constituting the ohmic contact).

In certain example implementations, and with reference to FIG. 4, the "third region" 224 may be defined as a section of the interconnection 200 below (or in contact with) the wire bond 202. In accordance with certain example implementations of the disclosed technology, the "third region" 224 may be included as part of the "second region" 222.

According to an example implementation of the disclosed technology, the interconnection 200 scheme as depicted in FIGS. 3 and 4 may provide the added technical benefit of increased capability and reliability of a sensor and/or other electronic device at high temperatures, as compared with the conventional approach (such as depicted in FIGS. 1 and 2). In an example implementation, the separation D configured between the wire bond 202 (or appropriate joining techniques) and the ohmic contact to the semiconductor layer 210 (which can include metal silicide 212 or other metal-semiconductor compounds) may reduce or eliminate degradation of one or more of the interconnect layers. In certain example implementations, the reliability at high temperatures may be based on the reliability of the layered contact structure located in the area located over the metal silicide 212 (or over other metal-semiconductor compounds constituting the ohmic contact), on the reliability of the electrical interconnection made by the wire bond 202 (or by other appropriate joining techniques to the metal layer deposited on top of the oxide or of other dielectrically insulating layers), on the reliability and stability of the metal layer deposited on top of the oxide or of other dielectrically insulating layers, and/or on the minimization of diffusion, drift, and/or migration of atoms from the material used for the electrical interconnections made by wire bonding or by other appropriate joining techniques through the metal layer deposited on top of the oxide or of other dielectrically insulating layers.

Figure 5:
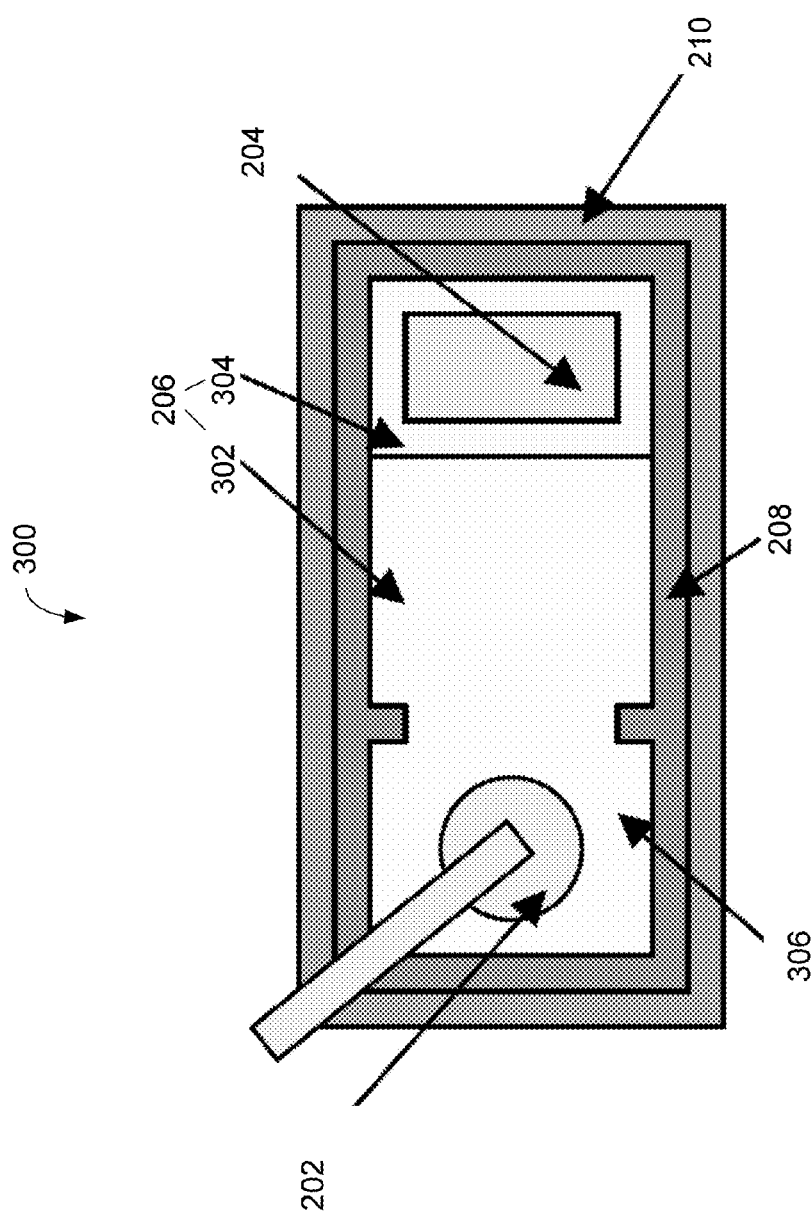
FIG. 5 depicts a top view of an interconnection 300 and associated layout scheme, according to another example implementation of the disclosed technology.

FIG. 5 depicts a top view of an interconnection 300 and associated layout scheme, according to another example implementation of the disclosed technology. In this example implementation, the metal-on-oxide layer(s) 206 region may include regions having different metal thicknesses. For example, a first portion 302 of the metal-on-oxide layer(s) 206 may be characterized as having a first thickness, while the second portion 304 of the metal-on-oxide layer(s) 206 may be characterized as having a second thickness. In one example implementation, the first portion 302 may be thinner than the second portion 304.

Figure 6:
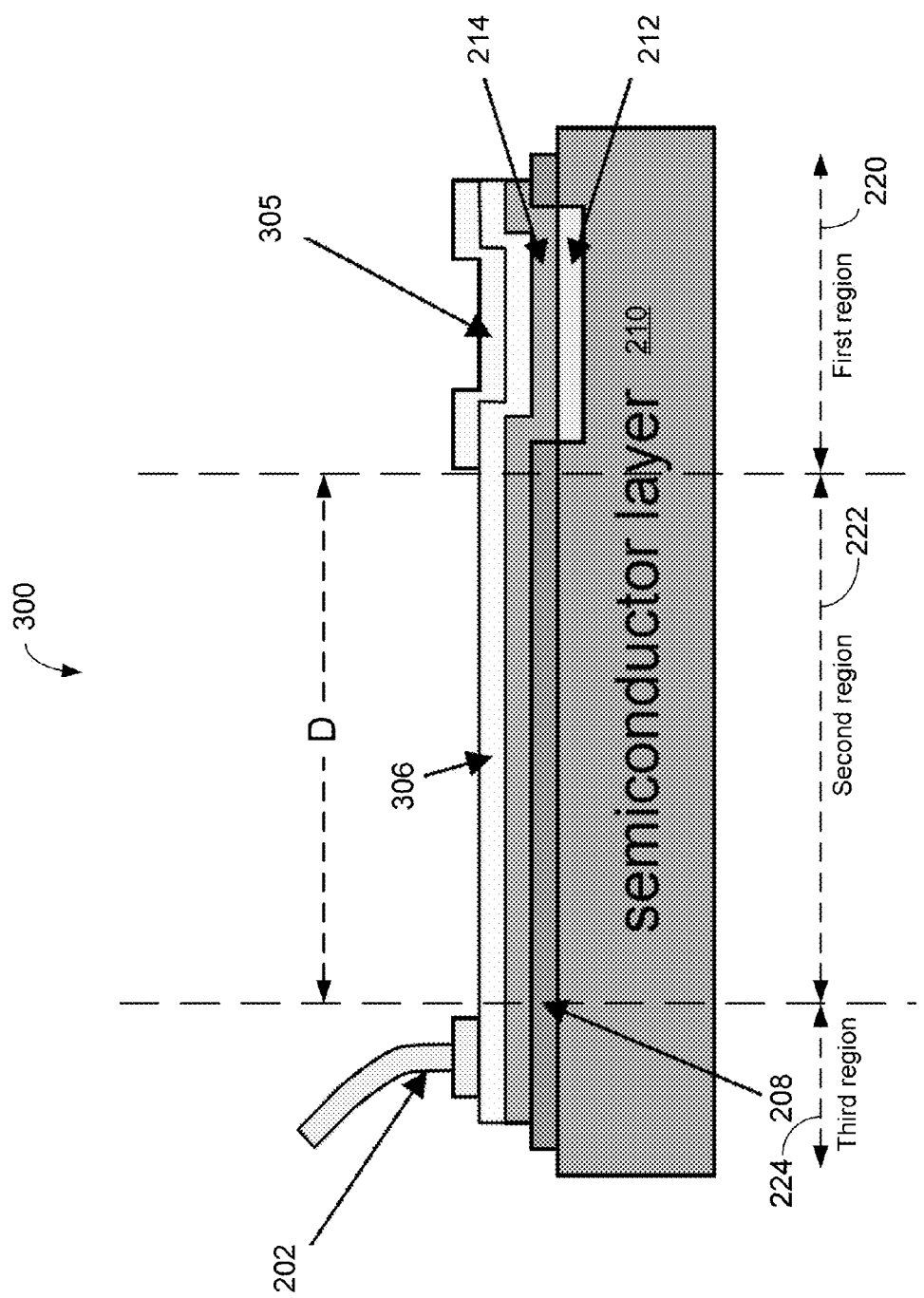
FIG. 6 depicts a cross sectional side-view of the interconnection 300, as shown in FIG. 4, according to an example implementation of the disclosed technology.

FIG. 6 depicts a cross sectional side-view of the interconnection 300, as shown in FIG. 5, according to an example implementation of the disclosed technology.

The contact pattern layouts and structures as shown in FIGS. 5 and 6 may include some similar components as described above with respect to the embodiment of FIGS. 3 and 4 (such as the wire bond 202, metal-on-metal silicide layer(s) 204, oxide layer 208, metal silicide layer 212, and/or diffusion barrier/adhesion layer(s) 214). However, in this example implementation, a thin metal layer 306 may be placed on top of the diffusion barrier/adhesion layer(s) 214. According to an example implementation of the disclosed technology, the thin metal layer 306 may be optimized (for example, to decrease mechanical stress in the thin metal layer 306) for adhesion reliability of the wire bond 202, ohmic contact to the adjacent layers, materials, and/or device contacts, and/or for contact stability and reliability at high temperatures. In this respect, certain example implementations may further ease fabrication and/or processing of the device. Furthermore, in an example implementation, the top metal layer 305 may be configured to cover a portion of the thin metal layer 306, and this top metal layer 305 may be separately optimized for reliable ohmic contact to adjacent layers and materials of the device contacts, and/or for contact stability and reliability at high temperatures.

In accordance with an example implementation of the disclosed technology, the thicknesses and/or lateral dimensions of the thin metal layer 306 and/or the separate top metal layer 305 may allow for independent optimization of these and related components for high temperature reliability. For example, long term, high temperature reliability of contacts may require thicker metal layers deposited over the metal silicide or over other metal-semiconductor compounds constituting the ohmic contact, while thinner metal layers may be deposited on top of the oxide or of other dielectrically insulating layers for increased film adhesion due to decreased mechanical stress in the thin film/layer.

In accordance with various example implementations of the disclosed technology, example approximate thickness ranges associated with the various layers are summarized below in Table 1.

TABLE 1

| LAYER | Approximate thickness ranges (Angstroms) |
|---|---|
| thin metal layer 306 | 500-2000 |
| top metal layer 305 | 1000-5000 |
| Diffusion barrier and/or adhesion layer(s) 214 | 50-1000 |

In accordance with various example implementations of the disclosed technology, an example range of approximate width and lateral length dimensions associated with various layers are summarized below in Table 2.

| LAYER | width (microns) | lateral length or offset (microns) |
|---|---|---|
| thin metal layer 306 | 250-500 | 200-2000 |
| top metal layer 305 | 250-500 | 50-100 |
| metal silicide layer 212 | 250-500 | 50-100 |

In accordance with an example implementation of the disclosed technology, the metal layers, as shown and described with reference to FIGS. 5 and 6, may be fabricated using lift-off or similar semiconductor device fabrication techniques.

Figure 7:
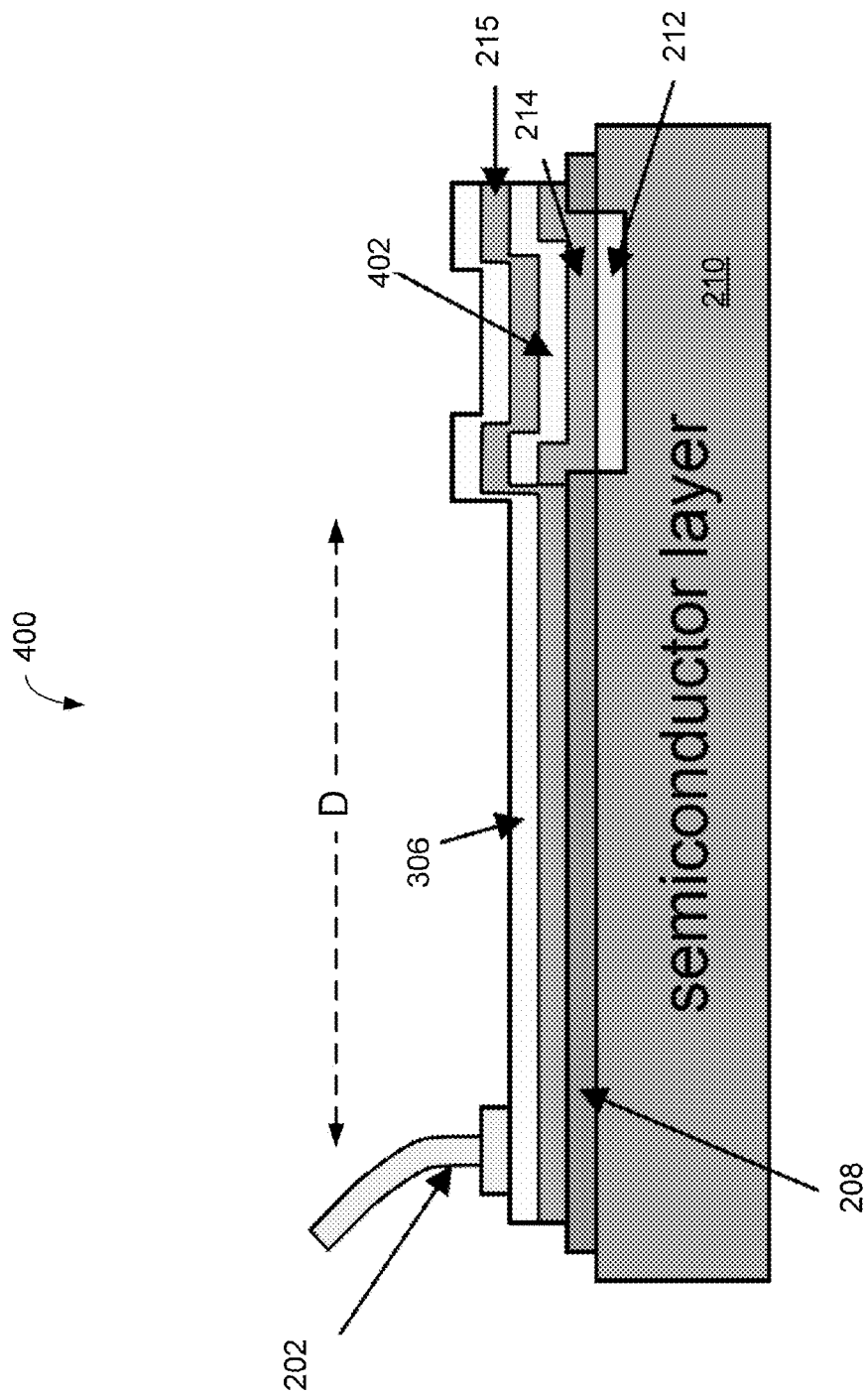
FIG. 7 depicts a cross sectional side-view of another interconnection 400, according to an example implementation of the disclosed technology.

FIG. 7 depicts a cross sectional side-view of another interconnection 400 scheme, according to an example implementation of the disclosed technology. This example implementation may include some similar components and layers as described above with respect to the embodiment of FIGS. 5 and 6 (such as the wire bond 202, metal-on-metal 305 306, oxide layer 208, metal silicide layer 212, thin metal layer 306, and semiconductor layer 210). However, in this example implementation, an intermediary metallic layer 402 may be placed between diffusion barrier/adhesion layer(s) 214, 215. Furthermore, in certain example implementations, the thin metal layer 306 may cover all or a portion of the multilayer structure, including the top diffusion barrier/adhesion layer(s) 215.

In accordance with certain example implementations of the disclosed technology, the interconnection 400 may be fabricated using wet etching, plasma etching, reactive ion etching, liftoff, or similar semiconductor device fabrication techniques.

In certain example implementations, the multilayer interconnect 400 structure as shown in FIG. 7 may enable independent optimization of the various layers and their fabrication for ohmic contact, adhesion, high temperature reliability, and reduced degradation due to persistent diffusion, drift, or migration of atoms through the metal layer deposited on top of the oxide or of other dielectrically insulating layers. In accordance with an example implementation of the disclosed technology, by appropriately choosing the distance D between the wire bond 202 (or other electrical connection to the device) and the area located over the metal silicide 212 (or over other metal-semiconductor compounds constituting the ohmic contact), the diffusion, drift, or migration of atoms can be delayed and prevented from reaching the metal silicide (or other metal-semiconductor compounds) constituting the ohmic contact for practical high temperature applications. According to certain example implementations of the disclosed technology, the range for the distance D may be selected to be approximately within about 100 micrometers to approximately 2000 micrometers.

Figure 8:
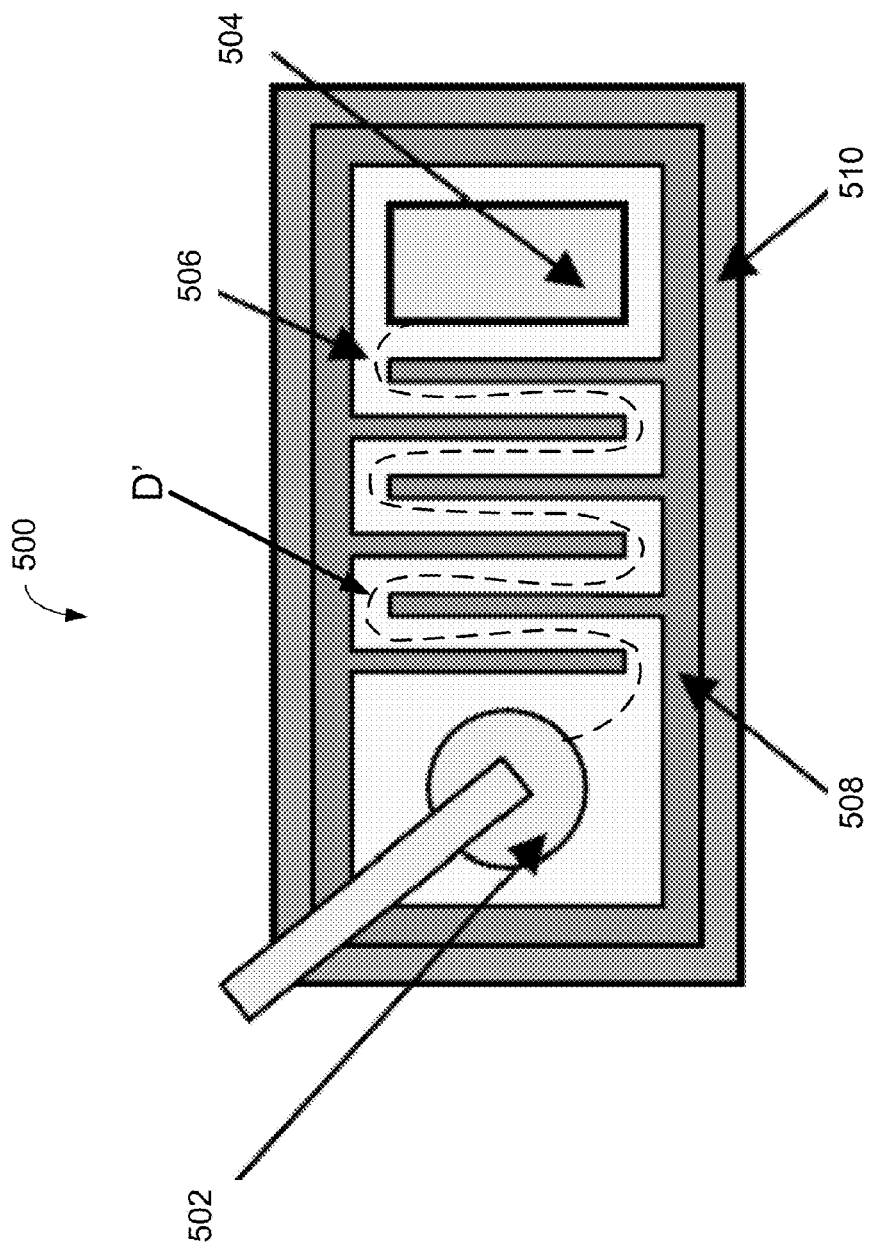
FIG. 8 depicts a top view of an interconnection 500 and associated layout scheme, according to another example implementation of the disclosed technology.

FIG. 8 depicts a top view of another interconnection 500 and associated layout scheme, according to another example implementation of the disclosed technology. In this example implementation, a wire bond 502 region may be offset from a metal-on-silicide region 504 by a metal-on-oxide region 506 having a serpentine pattern defined (our bounded) by an oxide layer 508. This serpentine shape allows for delineating a relatively long metal-on-oxide layer path length (for example, D', as depicted by the dotted line) over a relatively small surface of the interconnection 500. Accordingly, the serpentine path (i.e., effective offset) may result in a device having a relatively long path for the diffusion or migration of atoms (i.e., from the materials used for the wire bond to the metal silicide area) over a relatively small area or in a surface-constrained area.

In certain example implementations, a serpentine path (or similar circuitous film layout) may provide a significant decrease in metal film stress, and a significant increase in metal film adhesion to the oxide layer due to the relatively short metal layer segments, each with significantly lower film stress and significantly better adhesion to the underlying oxide layer than a relatively long metal layer pattern.

Certain example implementations of the interconnection 500, as depicted in FIG. 8, may share similarities with the interconnection 200 as discussed above with reference to FIG. 3. For example, and according to an example implementation of the disclosed technology, the effects of diffusion, drift, and/or migration of metal atoms from the wire bond 502 to the metal-on-silicide region 504 may be reduced and/or delayed, at least in part, by the offset effective distance D', and/or the configuration of a large ratio of D' to the thickness (t1) of the metal-on-oxide 506. In certain example implementations, the D':t1 ratio may be configured to be in a range from about 2:1 to about 5:1. In certain example implementations, the D':t1 ratio may be configured to be in a range from about 3:1 to about 10:1. In other example implementations, the D':t1 ratio may be configured to be in a range between about 5:1 to about 20:1. In other example implementations, the D':t1 ratio may be configured to be in a range between about 10:1 to about 50:1. In other example implementations, the D':t1 ratio may be configured to be in a range between about 20:1 to about 100:1. In other example implementations, the D':t1 ratio may be configured to be in a range between about 50:1 to about 500:1. In other example implementations, the D':t1 ratio may be configured to be in a range between about 100:1 to about 1000:1. In other example implementations, the D':t1 ratio may be configured to be in a range between about 500:1 to about 5000:1.

Figure 9:
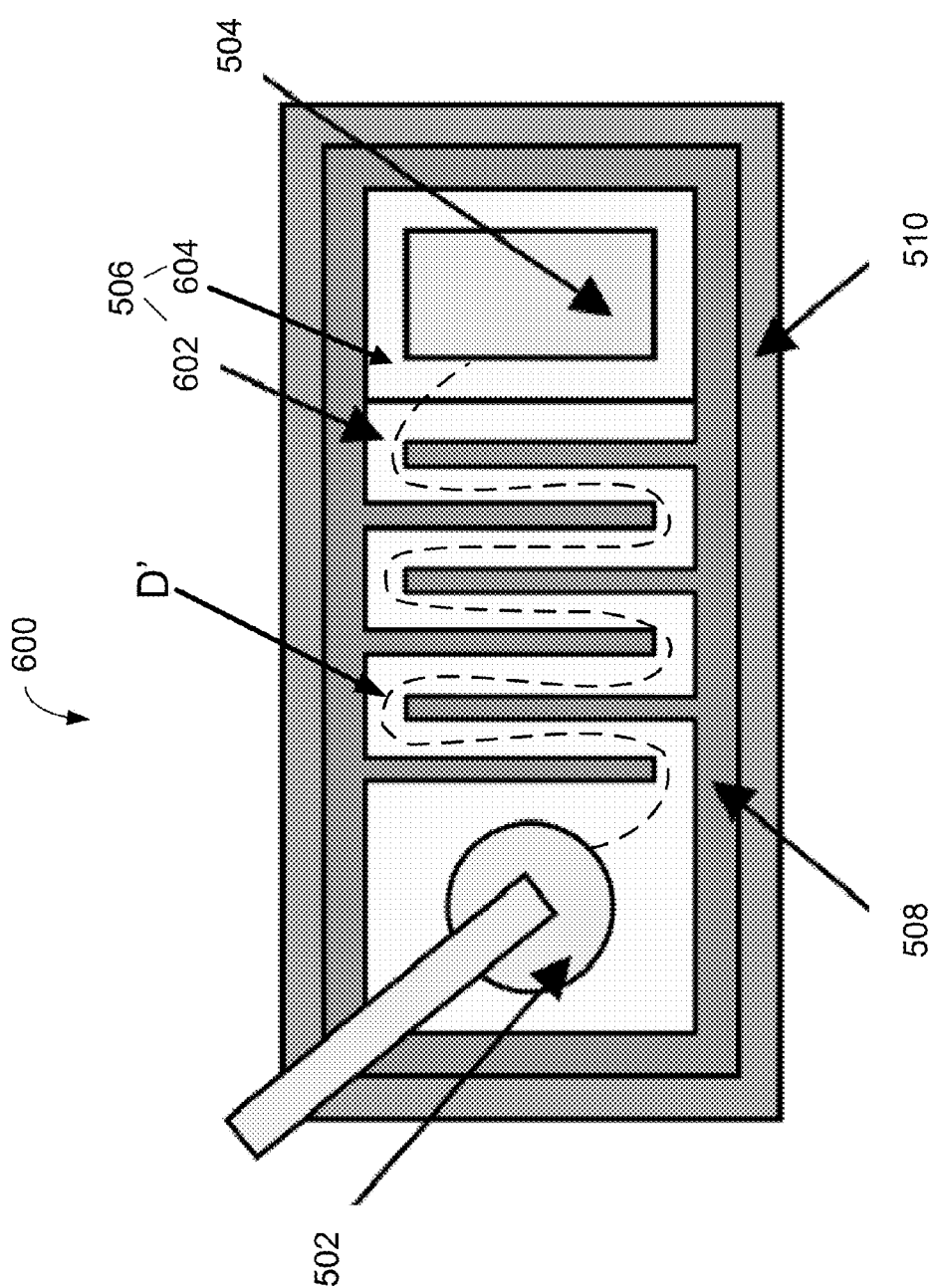
FIG. 9 depicts a top view of an interconnection 600 and associated layout scheme, according to another example implementation of the disclosed technology.

FIG. 9 depicts a top view of an interconnection 600 and associated layout scheme, according to another example implementation of the disclosed technology. Certain example implementations of the interconnection 600 may share similarities with the interconnection 300 as discussed above with reference to FIG. 5. This example implementation is also similar to the interconnection 500 as discussed above with reference to FIG. 8, but with the metal-on-oxide layer(s) 506 having different metal thicknesses. For example, a first portion 602 of the metal-on-oxide layer(s) 506 may be characterized as having a first thickness, while the second portion 504 of the metal-on-oxide layer(s) 606 may be characterized as having a second thickness. In one example implementation, the first portion 602 may be thinner than the second portion 604.

Figure 10:
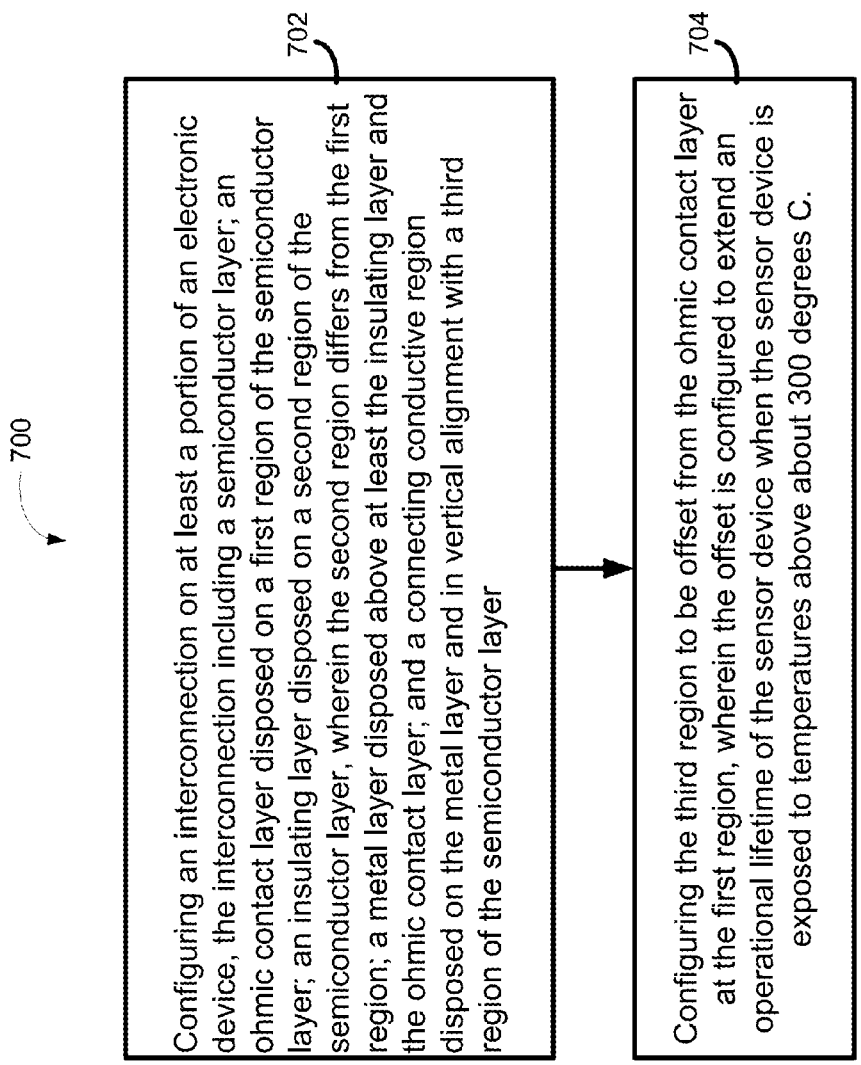
FIG. 10 is a flow diagram 700 of a method, according to an example implementation of the disclosed technology.

FIG. 10 is a flow diagram 700 of a method, according to an example implementation of the disclosed technology. In block 702, the method 700 can include configuring an interconnection on at least a portion of an electronic device. The interconnection includes: a semiconductor layer; an ohmic contact layer disposed on a first region of the semiconductor layer; an insulating layer disposed on a second region of the semiconductor layer, wherein the second region differs from the first region; a metal layer disposed above at least the insulating layer and the ohmic contact layer; and a connecting conductive region disposed on the metal layer and in vertical alignment with a third region of the semiconductor layer. In block 704, the method 700 includes configuring the third region to be offset from the ohmic contact layer at the first region, wherein the offset is configured to extend an operational lifetime of the sensor device when the sensor device is exposed to temperatures above about 300 degrees C.

As discussed herein, the offset D and/or D' (which can correspond to the second region between the first region and the third region) in relation to the individual and/or combined thicknesses t1, t2 is configured to extend the operational lifetime of the interconnection by greater than about 500 hours when the apparatus is exposed to temperatures up to about 600 degrees C.

According to an example implementation of the disclosed technology, the third region differs from the first region and is offset from the ohmic contact layer (at the first region) by a predetermined distance D or D'.

In an example implementation, the metal layer is characterized by a nominal thickness t1 and wherein a ratio of the distance D (or D') to the thickness t1 is at least 4 to 1.

In certain example implementations, the distance D (or D') is configured to be between about 100 micrometers and about 2000 micrometers.

According to an example implementation of the disclosed technology, the offset distance D (or D') is configured to inhibit and/or delay one or more of diffusion, drift, and migration of atoms from the wire bond through the metal layer to the ohmic contact layer.

Certain example implementations may include a first diffusion barrier layer disposed between the metal layer and at least the insulating layer, wherein a thickness of the first diffusion barrier layer may be configured to be between about 50 Angstrom and about 1000 Angstrom.

Certain example implementations may include an adhesion layer disposed between the metal layer and at least the insulating layer. In certain example implementations, the adhesion layer may be disposed between the metal layer and the ohmic contact layer.

According to an example implementation of the disclosed technology, a metal layer may be disposed on the insulating layer and the ohmic contact layer without an adhesion layer.

In certain example implementations, a thickness of the metal layer may be configured to be between about 500 Angstrom and about 5000 Angstrom.

According to an example implementation of the disclosed technology, the connecting conductive region can include a wire bond.

Certain example implementations may further include an intermediary metal layer disposed on at least a portion of the first diffusion barrier and in vertical alignment with the first region.

Certain example implementations, may further include a second diffusion barrier layer disposed on at least a portion of the intermediary metal layer and in electrical communication with the first diffusion barrier layer, and wherein the metal layer is further disposed on the second diffusion barrier layer.

In some implementations, the diffusion barrier layer(s) may include or act an adhesion layer.

In accordance with an example implementation of the disclosed technology, sensors and/or other electronic devices may be designed using the disclosed technology for long term reliable operation at high temperatures (for example, up to an over 600° C.), with device lifetimes at high temperature greater than 1000 hours.

In an example implementation, the offset distance D (or D') between the ohmic contact layer at the first region and the connecting conductive region (i.e., wire bond region) in vertical alignment with the third region is configured to inhibit and/or delay diffusion, drift, or migration of atoms from or through the metal layer to the ohmic contact layer. For example, for the dimensions of the various layers as shown in Table 1 and Table 2, and for operation temperatures in the range of 500-700 degrees C., the usable lifetime of the device may be extended by up to and/or over 1000 hours, as compared with standard approaches.

In an example implementation, the insulating layer may comprise an oxide. In certain example implementations, the ohmic contact layer can include a metal silicide. In an example implementation, the diffusion barrier layer may comprise a metal. In certain example implementations, the first diffusion barrier layer may be contiguous over the first, second, and third regions.

In an example implementation, the connecting conductive region comprises a wire bond. In an example implementation, the connecting conductive region comprises a pad suitable for flip-chip-bonding.

In an example implementation, a top metal layer may be disposed on the metal layer and in vertical alignment with the first region.

Certain example implementations may further include an intermediary metal layer disposed on at least a portion of the first diffusion barrier and/or adhesion layer and in vertical alignment with the first region of the semiconductor layer.

Certain example implementations may further include a second diffusion barrier and/or adhesion layer disposed on at least a portion of the intermediary metal layer and in electrical communication with the first diffusion barrier and/or adhesion layer, and wherein the metal layer is further disposed on the second diffusion barrier and/or adhesion layer.

It is important to recognize that it is impractical to describe every conceivable combination of components or methodologies for purposes of describing the claimed subject matter. However, a person having ordinary skill in the art will recognize that many further combinations and permutations of the subject technology are possible. Accordingly, the claimed subject matter is intended to cover all such alterations, modifications, and variations that are within the spirit and scope of the claimed subject matter.

Throughout the specification and the claims, the following terms take at least the meanings explicitly associated herein, unless the context clearly dictates otherwise. The term "connect," "connecting," and "connected" mean that one function, feature, structure, or characteristic is directly joined to or in communication with another function, feature, structure, or characteristic. The term "couple," "coupling," and "coupled" mean that one function, feature, structure, or characteristic is directly or indirectly joined to or in communication with another function, feature, structure, or characteristic. Relational terms such as "first" and "second," and the like may be used solely to distinguish one entity or action from another entity or action without necessarily requiring or implying any actual such relationship or order between such entities or actions. The term "or" is intended to mean an inclusive "or." Further, the terms "a," "an," and "the" are intended to mean one or more unless specified otherwise or clear from the context to be directed to a singular form. The term "include" and its various forms are intended to mean including but not limited to. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. A device or structure that is "configured" in a certain way is configured in at least that way, but may also be configured in ways that are not listed.

As disclosed herein, numerous specific details are set forth. However, it is to be understood that embodiments of the disclosed technology may be practiced without these specific details. References to "one embodiment," "an embodiment," "example embodiment," "various embodiments," and other like terms indicate that the embodiments of the disclosed technology so described may include a particular function, feature, structure, or characteristic, but not every embodiment necessarily includes the particular function, feature, structure, or characteristic. Further, repeated use of the phrase "in one embodiment" does not necessarily refer to the same embodiment, although it may.

Although this disclosure describes specific examples, embodiments, and the like, certain modifications and changes may be made without departing from the scope of the disclosed technology, as set forth in the claims below. For example, although the example methods, devices and systems, described herein are in conjunction with a pressure transducer or a sensor, the skilled artisan will readily recognize that the example methods, devices or systems may be used in other methods, devices or systems and may be configured to correspond to such other example methods, devices or systems as needed. Further, while at least one example, embodiment, or the like has been presented in the detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments or examples are not intended to be construed as a critical, required, or essential feature or element of any or all of the claims.

What is claimed is:

1. An interconnection apparatus, comprising:
    a semiconductor layer;
    an ohmic contact layer disposed on a first region of the semiconductor layer;
    an insulating layer disposed on a second region of the semiconductor layer, wherein the second region differs from the first region;
    a metal layer disposed above at least the insulating layer and the ohmic contact layer;
    a connecting conductive region disposed on the metal layer and in vertical alignment with a third region of the semiconductor layer;
    wherein the third region differs from the first region and is offset from the ohmic contact layer at the first region; and
    wherein the offset is configured to extend an operational lifetime of the interconnection apparatus when the interconnection apparatus is exposed to temperatures in the range of 300 degrees C. to 700 degrees C.

2. The interconnection apparatus of claim 1, wherein the offset extends the operational lifetime by greater than about 500 hours when the interconnection apparatus is exposed to temperatures up to about 600 degrees C.

3. The interconnection apparatus of claim 1, further comprising a first diffusion barrier layer disposed between the metal layer and the insulating layer, wherein a thickness of the first diffusion barrier layer is configured to be between about 50 Angstrom and about 1000 Angstrom.

4. The interconnection apparatus of claim 3, further comprising an intermediary metal layer disposed on at least a portion of the first diffusion barrier and in vertical alignment with the first region.

5. The interconnection apparatus of claim 4, further comprising a second diffusion barrier layer disposed on at least a portion of the intermediary metal layer and in electrical communication with the first diffusion barrier layer, and wherein the metal layer is further disposed on the second diffusion barrier layer.

6. The interconnection apparatus of claim 5, wherein the second diffusion barrier layer comprises an adhesion layer.

7. The interconnection apparatus of claim 1, further comprising an adhesion layer disposed between the metal layer and the insulating layer.

8. The interconnection apparatus of claim 7, wherein the adhesion layer is further disposed between the metal layer and the ohmic contact layer.

9. The interconnection apparatus of claim 1, wherein the metal layer is disposed on the insulating layer and the ohmic contact layer.

10. The interconnection apparatus of claim 1, wherein the third region differs from the first region and is offset from the ohmic contact layer at the first region by a predetermined path length.

11. The interconnection apparatus of claim 10, wherein the metal layer is characterized by a nominal thickness t1 and wherein a ratio of the path length to the thickness t1 is at least 4 to 1.

12. The interconnection apparatus of claim 10, wherein the path length is configured to be between about 100 micrometers and about 2000 micrometers.

13. The interconnection apparatus of claim 10, wherein the offset is linear.

14. The interconnection apparatus of claim 10, wherein the offset is serpentine shaped.

15. The interconnection apparatus of claim 1, wherein the offset is configured to inhibit one or more of diffusion, drift, and migration of atoms from or through the metal layer to the ohmic contact layer.

16. The interconnection apparatus of claim 1, wherein a thickness of the metal layer is configured to be between about 500 Angstrom and about 5000 Angstrom.

17. The interconnection apparatus of claim 1, wherein the connecting conductive region comprises a wire bond.

18. A system, comprising:
    a sensor device comprising an interconnection, the interconnection comprising:
    a semiconductor layer;
    an ohmic contact layer disposed on a first region of the semiconductor layer;
    an insulating layer disposed on a second region of the semiconductor layer, wherein the second region differs from the first region;
    a metal layer disposed above at least the insulating layer and the ohmic contact layer;
    a connecting conductive region disposed on the metal layer and in vertical alignment with a third region of the semiconductor layer;
    wherein the third region differs from the first region and is offset from the ohmic contact layer at the first region; and
    wherein the offset is configured to extend an operational lifetime of the sensor device when the sensor device is exposed to temperatures in the range of 300 degrees C. to 700 degrees C.

19. The system of claim 18, wherein the offset extends the operational lifetime of the sensor device by greater than about 500 hours when the sensor device is exposed to temperatures up to about 600 degrees C.

20. A method, comprising:
    configuring an interconnection on at least a portion of an electronic device, the interconnection comprising:
    a semiconductor layer;
    an ohmic contact layer disposed on a first region of the semiconductor layer;
    an insulating layer disposed on a second region of the semiconductor layer, wherein the second region differs from the first region;
    a metal layer disposed above at least the insulating layer and the ohmic contact layer;

a connecting conductive region disposed on the metal layer and in vertical alignment with a third region of the semiconductor layer; and configuring the third region to be offset from the ohmic contact layer at the first region, wherein the offset is configured to extend an operational lifetime of the sensor device when the sensor device is exposed to temperatures in the range of 300 degrees C. to 700 degrees C.

21. The method of claim 20, wherein the offset is configured to extend the operational lifetime by greater than about 500 hours when the interconnection apparatus is exposed to temperatures up to about 600 degrees C.

22. The method of claim 20, wherein the offset is configured to inhibit one or more of diffusion, drift, and migration of atoms from or through the metal layer to the ohmic contact layer.

* * * * *